(12) United States Patent
Hine et al.

(10) Patent No.: US 6,591,160 B2
(45) Date of Patent: Jul. 8, 2003

(54) SELF TEACHING ROBOT

(75) Inventors: Roger G. Hine, San Carlos, CA (US); Graham L. Hine, Sunnyvale, CA (US)

(73) Assignee: Asyst Technologies, Inc., Fremont, CA (US)

( * ) Notice: Subject to any disclaimer, the term of this patent is extended or adjusted under 35 U.S.C. 154(b) by 33 days.

(21) Appl. No.: 09/729,463

(22) Filed: Dec. 4, 2000

(65) Prior Publication Data

US 2002/0068992 A1 Jun. 6, 2002

(51) Int. Cl.[7] ............................................. G06F 7/00
(52) U.S. Cl. ...................... 700/218; 700/229; 700/190; 700/217; 700/189
(58) Field of Search ................................ 700/229, 190, 700/217, 218

(56) References Cited

U.S. PATENT DOCUMENTS

| | | | |
|---|---|---|---|
| 4,547,800 A | * 10/1985 | Masaki ........................ 358/107 |
| 4,744,039 A | 5/1988 | Suzuki et al. | |
| 4,945,493 A | 7/1990 | Huang et al. | |
| 5,297,238 A | 3/1994 | Wang et al. | |
| 5,315,222 A | 5/1994 | Kasagami et al. | |
| 5,371,836 A | 12/1994 | Mitomi et al. | |
| 5,579,444 A | 11/1996 | Dalziel et al. | |
| 5,802,201 A | * 9/1998 | Nayar et al. ................. 382/153 |
| 5,987,349 A | 11/1999 | Schultz | |
| 5,988,971 A | * 11/1999 | Fossey et al. ................ 414/416 |
| 6,157,873 A | 12/2000 | DeCamp et al. | |
| 6,163,946 A | * 12/2000 | Pryor ....................... 29/407.04 |
| 6,166,801 A | * 12/2000 | Dishon et al. ................ 355/27 |
| 6,217,803 B1 | * 4/2001 | Uozumi ....................... 264/407 |
| 6,318,951 B1 | * 11/2001 | Schmidt et al. .......... 414/744.5 |
| 6,341,007 B1 | * 1/2002 | Nishi et al. .................... 355/53 |
| 6,400,445 B2 | 6/2002 | Nishi et al. | |
| 6,411,386 B1 | 6/2002 | Nishi | |
| 6,425,865 B1 | 7/2002 | Salcudean et al. | |
| 6,447,668 B1 | * 9/2002 | Wang ........................... 205/645 |
| 6,452,134 B2 | * 9/2002 | Hong ....................... 219/124.34 |
| 6,460,369 B2 | * 10/2002 | Hosokawa .................... 62/378 |
| 6,466,841 B2 | * 10/2002 | DiStasio et al. ............. 700/213 |
| 6,490,369 B1 | * 12/2002 | Beiman ....................... 382/153 |
| 6,498,350 B2 | * 12/2002 | Kwan et al. ............ 250/442.11 |
| 6,516,244 B1 | * 2/2003 | Yoo et al. .................... 700/218 |
| 6,522,386 B1 | * 2/2003 | Nishi ........................... 355/52 |

* cited by examiner

*Primary Examiner*—Donald P. Walsh
*Assistant Examiner*—Michael E. Butler
(74) *Attorney, Agent, or Firm*—O'Melveny & Myers LLP (57) ABSTRACT

A robot calibration system for calibration of a workpiece handling robot relative to a station. The workpiece handling robot includes a sensor mounted on an end effector. The robot calibration system also includes a target, which in coordination with the sensor, allows a control system to determine a center of the target. The target is a wafer in the shape of a disk. A pattern is on at least one side of the workpiece, preferably on a bottom side of the target. The pattern comprises alternating black and white areas. The workpiece handling robot is placed in front of the station which includes a cassette mounted thereon. The cassette has a support surface which supports the target. Once the z-height of the end effector is established with the end effector being in close proximity to a lowermost support surface of the cassette, the end effector proceeds to move in a search pattern searching the pattern for transition points from black to white areas. The control system stores these transition points and uses the transition points in an algorithmic equation to determine the center of the target. Once the center of the target has been identified, the control system knows the spacial relation between the robot and the station, and in particular the position of the workpieces at the station. The station may thereafter be loaded with workpieces and processed accordingly.

12 Claims, 10 Drawing Sheets

SELF TEACHING ROBOT

BACKGROUND OF THE INVENTION

1. Field of the Invention

The present invention relates to semiconductor wafer handling and processing equipment, and in particular, to a method and apparatus for calibration of a wafer handling robot relative to a station in a semiconductor workpiece tool.

2. Description of the Related Art

The introduction of workpiece handling robots into the semiconductor wafer fabrication process represented a significant advance in automation over manual and early transfer equipment for moving wafers between various stations at a workpiece tool, such as process tools and/or workpiece storage and handling locations. It is an important feature of conventional workpiece handling robots to be able to quickly and precisely access a workpiece from a first position, deliver it to a new location having different X, Y and Z coordinates in cartesian space, and set it down without risk of damage to the workpiece.

In order to accomplish this, a typical robot includes a shaft mounted in a base for translation along a vertical axis. A first arm, or link, is rotatably mounted to an upper end of the shaft, and a second arm, or link, is rotationally mounted to the opposite end of the first arm. The workpiece handling robot further includes an end effector pivotally attached to the second arm for supporting the workpiece. Various motors are further provided, conventionally mounted in the base, for translating the shaft, and for rotating the first and second arms such that the end effector may be controllably maneuvered in three-dimensional space.

To ensure that the end effector of the workpiece handling robot is precisely located during handling of workpieces, the robot must be calibrated relative to a workstation to and from which the robot transfers the workpieces. Each time the workstation is moved, as for example when it is replaced or repaired, the calibration process must be performed to ensure proper positioning of the robot to the workstation. Often a single robot operates with a plurality of work stations within a workpiece tool. In this instance, not only must the robot be calibrated to work with each of the stations, but any time one of the stations is moved, for reasons explained hereinafter, not only must the robot be re-calibrated to operate with the moved station, but it often must be re-calibrated to operate with each of the workstations serviced by that robot.

The calibration, or "teaching", of a robot allows the robot to commit to stored memory the location of the station(s) relative to the robot. In order to calibrate (or re-calibrate) the robot to a particular station, a rough approximation of the correct positioning between the robot and station is established by the operator. Thereafter, the end effector is moved to the position on the workstation which the operator estimates is the proper position of the end effector to drop off and acquire workpieces to and from the station. Typically, the operator visually aligns an end effector with the center position of the workpiece supported in a cassette on the station. The operator may use a remote control "teach pendant" to position the end effector, or the operator may manually drag the end effector into what the operator estimates to be the proper position. This relative position between the robot and station is then stored in memory.

Conventional calibration procedures have many disadvantages. Visually aligning the end effector with the center of the workpiece has proven to be inaccurate and subjective because it is dependent on the accuracy of each individual operator. Furthermore, the structure of the cassette largely prevents visual inspection of a workpiece therein to determine its center. The operator in most cases only has visual access through a front of the cassette through which the workpieces are transferred. Moreover, in the case where the operator manually drags the arm of the robot, additional forces are placed on the robot which can lead to later difficulties with the functioning of the robot.

In addition, the calibration procedures have not been repeatable because there are no standard procedures for calibration of a workpiece handling robot to a station. One problem has been that the calibration procedure used by one operator to calibrate a workpiece handling robot to a station may be different than the calibration procedure used by a second operator calibrating the same robot to the same station. For example, a first operator may align a first point on the robot with the center of the workpiece, while a second operator uses a second, different point. This could result in faulty workpiece transfer to an existing station, even though the robot is properly calibrated to the new or modified station. Thus, as discussed above, when one station of a plurality of stations serviced by a single robot is added or otherwise moved, not only is it necessary to calibrate that particular station, but in many situations, each of the other stations must also be re-calibrated to ensure that each of the stations serviced by the robot are calibrated in the same way and off of the same reference points.

A still further problem has been that the calibration procedure used by the operator at one station may be different than the calibration procedure used by the same operator at a second station. As a result of these inconsistencies, one station may significantly out perform another station or cause damage to a workpiece. Since there is no repeatable and consistent calibration procedure, the reason for a particular performance at a station or for damage caused to a workpiece is not determinable.

Moreover, the calibration procedures have not been quantifiable because there is no way to compare the quality of the calibration procedure used by one operator to the quality of the calibration procedure used by a second operator. Similarly, there is no way to compare the quality of the calibration procedure used at one workstation to the quality of the calibration procedure used at a second workstation.

In an effort to deal with this problem, a known calibration method includes a sensor which is installed at every station in a workpiece tool. The sensor may be mounted at any position on the station which is reachable by the end effector so long as the location of the sensor does not interfere with the processing operations at the station. The calibration procedure is completed by having the robot seek the sensor in order to identify the location of the workpiece. This method has the advantage of eliminating errors due to operator inaccuracies. However, if there are a plurality of stations, each sensor must be mounted and calibrated with respect to the robot. For example, if there are twelve stations, then twelve sensors must be mounted and calibrated with respect to the wafer handling robot, or one sensor must be moved around manually to each of the twelve stations. Therefore, more sensors means the calibration system will be more expensive and time consuming.

In one known system, a support structure including a sensor is mounted directly to a work station in a know position relative to the work station. The robot is then coarsely aligned over the station, and is moved around so that the sensor can identify one or more outer edges of the robot. Once the outer edges of the robot have been identified, the position of the robot relative to the sensor and station can be determined and stored. A drawback to this type of system is that the sensor structure must either be mounted to each station, or a single sensor structure must be moved between each station, in order to align the robot to each station in the tool. Additionally, the sensor and control system are configured to identify the edges of an end effector of a single, known configuration. However, there is not a single uniform shape to end effectors, and thus the sensor structure has limited use.

SUMMARY OF THE INVENTION

It is therefore an advantage of the present invention to provide a robot calibration system which allows for determination of a position and orientation of a workpiece handling robot relative to workstations in a workpiece tool.

It is another advantage of the present invention to provide a robot calibration system which is time efficient and allows for easy calibration of the workpiece handling robot relative to a station.

It is still a further advantage of the present invention to provide a robot calibration system which allows for calibration of the workpiece handling robot relative to a plurality of stations in a single calibration session.

It is another advantage of the present invention to provide a robot calibration system which is inexpensive and requires only one sensor to detect relative position of robot and station in a horizontal plane.

It is a further advantage of the present invention to provide a robot calibration system which is capable of precise positional accuracy and repeatability.

It is yet a further advantage of the present invention to provide a robot calibration system which includes components that are easily accessible and visible to the operator.

It is yet another advantage of the present invention to provide a robot calibration system which is efficient by minimizing operator intervention during the calibration process.

It is still a further advantage of the present invention to provide a robot calibration system which utilizes a target which may fit into any station without interference.

It is another advantage of the present invention to provide a robot calibration system which includes a sensor on the workpiece handling robot that is easily and quickly attachable and detachable, or which may alternatively be built integrally into the end effector.

It is yet a further advantage of the present invention to provide a robot calibration system which is universally applicable to a majority of substrate handling tasks utilizing a robot.

It is still a further advantage of the present invention to provide a robot calibration system with a simple design and low number of parts to facilitate easy configuration.

These and other advantages are provided by the present invention, which in the preferred embodiment relates to a robot calibration system for determining a precise position of a workpiece handling robot relative to a workstation in a workpiece tool. In the preferred embodiment, the workpiece handling robot includes a sensor, preferably a retro-reflective optical sensor, located near an end of a robot end effector. The sensor is removably mounted on the end effector in between two fingers and a base portion which form a U-shaped wafer support platform. The sensitivity of the sensor may be set to detect a minor change in reflected light.

The robot calibration system further includes a target including a reflectance pattern on its surface, which target is located by an operator on the station. The target may be the same size or slightly larger than a typical workpiece loaded on the station, and is located on the station in the same position as workpieces that are to be transferred to and from the station by the robot. It is also contemplated that the target be different shapes and sizes than the typical workpieces used on the stations, provided that it sits in a fixed position on the station. By movement of the end effector around portions of the target, the sensor in combination with the robot control system is able to identify the center of the target. Once the center of the target on the station has been identified, the control system knows the spacial relation between the robot and the station, and in particular the position of the workpieces at the station. The identified center position of the target relative to the robot is then stored in the control system memory. Thereafter, the control system may return the end effector to that position to acquire wafers from or present wafers to the station.

The reflectance pattern on the target is on at least one side of the target and preferably on a bottom side of the target. While various reflectance patterns are contemplated, a preferred reflectance pattern on the target comprises four quadrants formed by alternating black areas and white areas. The four quadrants are bordered by two lines which are perpendicular and intersect. The intersection of the two lines represents the center of the target.

The target may be formed of any of various durable materials such as carbon fibre. Where carbon fibre is used, a white reflectance pattern may be applied to the black fibre. Alternatively, the target can be formed of a shiny material, with a black pattern applied to the surface. In a further alternative, both the white and black patterns can be applied to the target. Regardless of how the reflectance pattern is applied, the retro-reflective sensor is able to sense the transition between the black areas and the white areas on the target.

In operation, when it is desired to orient a robot to a station for workpiece transfer between the station and robot, the workpiece handling robot is placed in an approximate orientation to the station, which includes a support surface for the target to be supported thereon. The target may be placed in the bottommost slot in a workpiece cassette which is then placed on the support surface. Alternatively, the support surface may include structures for supporting the target at the same x, y, and z coordinates as would be a workpiece in the bottommost slot of a workpiece cassette on the support surface.

With the robot initially at its lowermost z-axis position, the arms of the robot move up vertically along the z-axis via the shaft with the end effector and sensor positioned under the target. The end effector further includes a vacuum sensor. When the end effector reaches the target, the vacuum sensor detects proximity between the workpiece and sensor. This position corresponds to the z-axis height of the robot for the end effector to be aligned under the bottommost workpiece in the cassette. The vertical position of the bottommost workpiece is stored in the control system.

The end effector then moves vertically down slightly from the target so that there is a small distance between the end effector and the target. The end effector proceeds to move in a search pattern moving in radial ("r") and rotational ("θ") directions relative to the central axis of the robot, searching the reflectance pattern of the target for transitions from black areas to white areas and visa-versa on the bottom of the target. It is understood that the end effector can maneuver under the target in alternative patterns, such as for example a circular pattern or a square pattern. The parameters determining the search patterns are stored in the control system, allowing the control system to control the maneuvering of the end effector through the search pattern automatically without operator intervention. An indicator, such as an LED light, on an arm of the robot indicates the transition from black areas to white areas and visa-versa. In one embodiment, the sensor is illuminated when located under the black area, and is not illuminated when located under the white area.

The end effector may take one entire pass under the target such that a complete search pattern is formed in order to determine the transition points between the quadrants. The location of four transition points are used by the control system to determine the location of the two lines and the coordinate where the two lines intersect. Using an algorithmic equation, the control system translates the location of the transition points, which are defined in a polar coordinate system (r, θ), into coordinates in a Cartesian coordinate system (x, y). As two points define a line, the control system uses the first and third transition points detected during the search pattern to determine the orientation of the first line, and then uses the second and fourth transition points to determine the orientation of the second line. The control system then determines the Cartesian coordinates of the point of intersection of the two lines by finding the single set of coordinates lying on both lines. The intersection of the two lines defines the center of the target. This point is then stored in the control system memory, and the end effector may thereafter be repeatedly located at this point to present and acquire workpieces to and from the workstation.

BRIEF DESCRIPTION OF THE DRAWINGS

The invention will now be described with reference to the drawings in which.

DETAILED DESCRIPTION

The invention will now be described with reference to FIGS. 1–12, which in general discloses a robot calibration system for calibration of a workpiece handling robot relative to a plurality of stations in a workpiece tool such that a control system is capable of identifying a spacial relation between the workpiece handling robot and the stations, and in particular a position of the workpieces at the stations. As used herein, the term workpiece tool, or tool by itself, refers to any of various tools within a wafer fab, including for example, processing tools used to form patterned layers of silicon, silicon compounds and metals on the wafer to define the individual IC devices; metrology tools used for performing various tests on wafers to ensure the wafers are fabricated to specification; and sorters, which perform various functions including the transfer of wafers between the various carriers positioned on the wafer sorter, the mapping of wafer location within a carrier cassette, and wafer identification. As used herein, the term workstation or station refers to any location within a workpiece tool at which workpieces are dropped off from and acquired by a workpiece handling robot.

While the present invention is described with respect to circular semiconductor wafers, it is understood that the present invention may be used to locate the center of any of various workpieces of known dimensions, circular, U-shaped, square or otherwise. In addition to semiconductor wafers, such workpieces also include reticles and flat panel displays. It is also understood that the present invention may be used with workpieces of various sizes, and the dimensions set forth below will vary accordingly.

Figure 1:
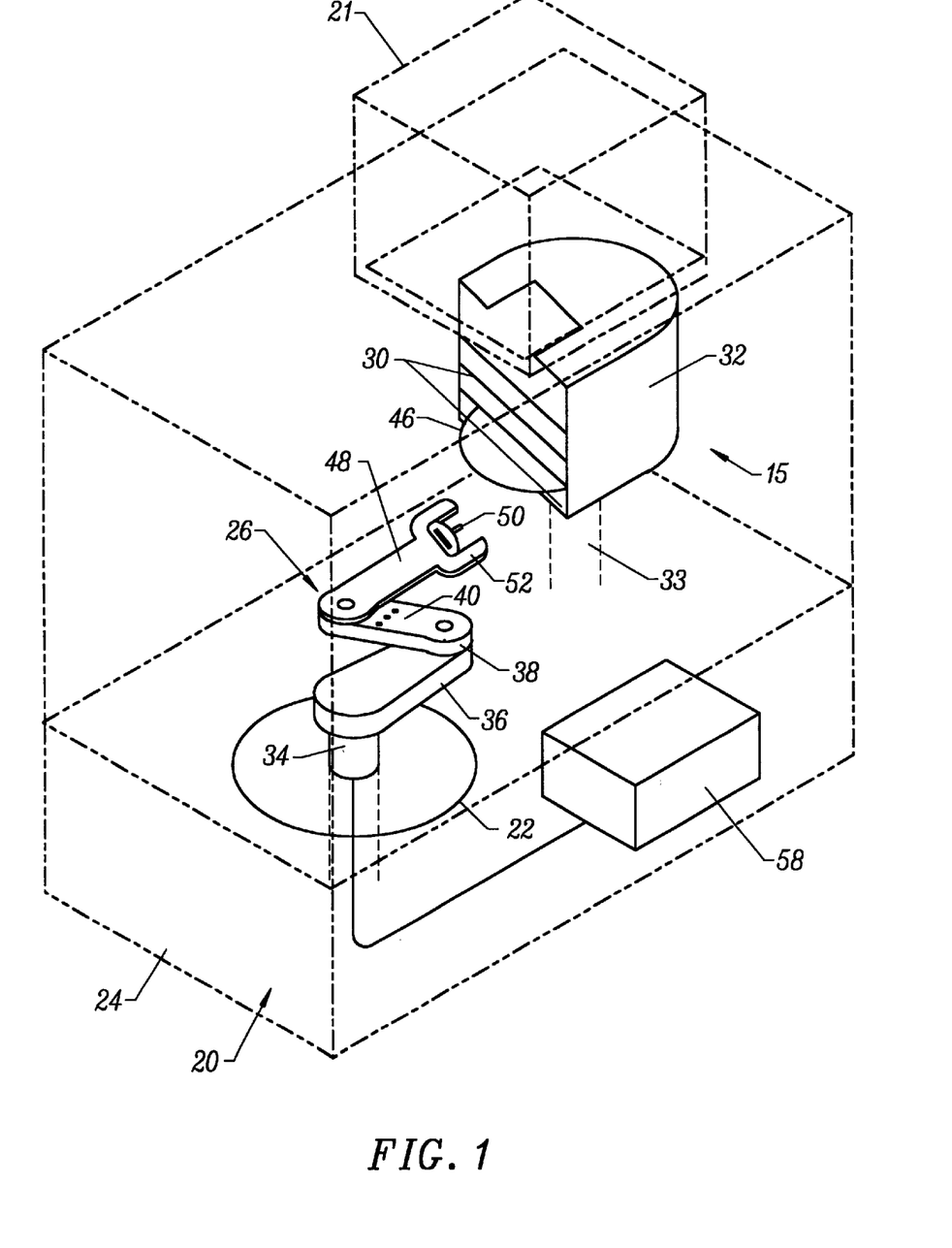
FIG. 1 is perspective views of a system according to the present invention including a robot calibration system for calibration of a workpiece handling robot position relative to a workstation.

The first embodiment of the present invention will now be described in reference to a workpiece handling robot which is calibrated to a single station. It is understood that the type of workstation utilized is not critical to the present invention and may vary significantly in alternative embodiments. For example, in FIG. 1, the workstation may comprise a load port, such as a conventional indexer, which receives a cassette-carrying pod, or a bare cassette, from another location within the fab and presents the cassette to a workpiece handling robot. Although the workstation in FIG. 1 is shown supporting the cassette, it is understood that the workstation may include a support surface capable of supporting individual workpieces. The calibration process according to the present invention may be carried out any time a workstation is added or otherwise repositioned with respect to a workpiece handling robot. Alternatively, the calibration process may be carried out any time a wafer handling robot is replaced or otherwise repositioned with respect to one or more workstations.

Referring now to a first embodiment of the present invention shown in FIG. 1, a minienvironment 20 includes a floor 22, and a control area 24 beneath the floor 22 for housing a control unit and mechanical devices as described hereinafter. The minienvironment includes a workpiece handling robot 26 for accessing workpieces, such as semiconductor wafers, from a workstation 15. The workstation in the illustrated embodiment may comprise, for example, a conventional indexer, which receives a cassette-carrying pod having a pod shell 21 and a pod door (not shown) on which a cassette 32 is supported. The indexer may alternatively receive a bare cassette 32. The cassette includes a plurality of shelves 30 on which each of the workpieces are supported in a parallel and spaced relation. The cassette and pod door are supported on a support surface, which would be a port door in an embodiment where the workstation comprises an indexer. An elevator 33 is provided for lowering the support surface, with the pod door and cassette supported thereon, to a height at which the robot 26 may access the workpieces from the shelves 30. Additionally, although the robot 26 and workstation 15 are shown situated within minienvironment 20 in FIG. 1, it is understood that the minienvironment may be omitted in alternative embodiments.

Figure 2:
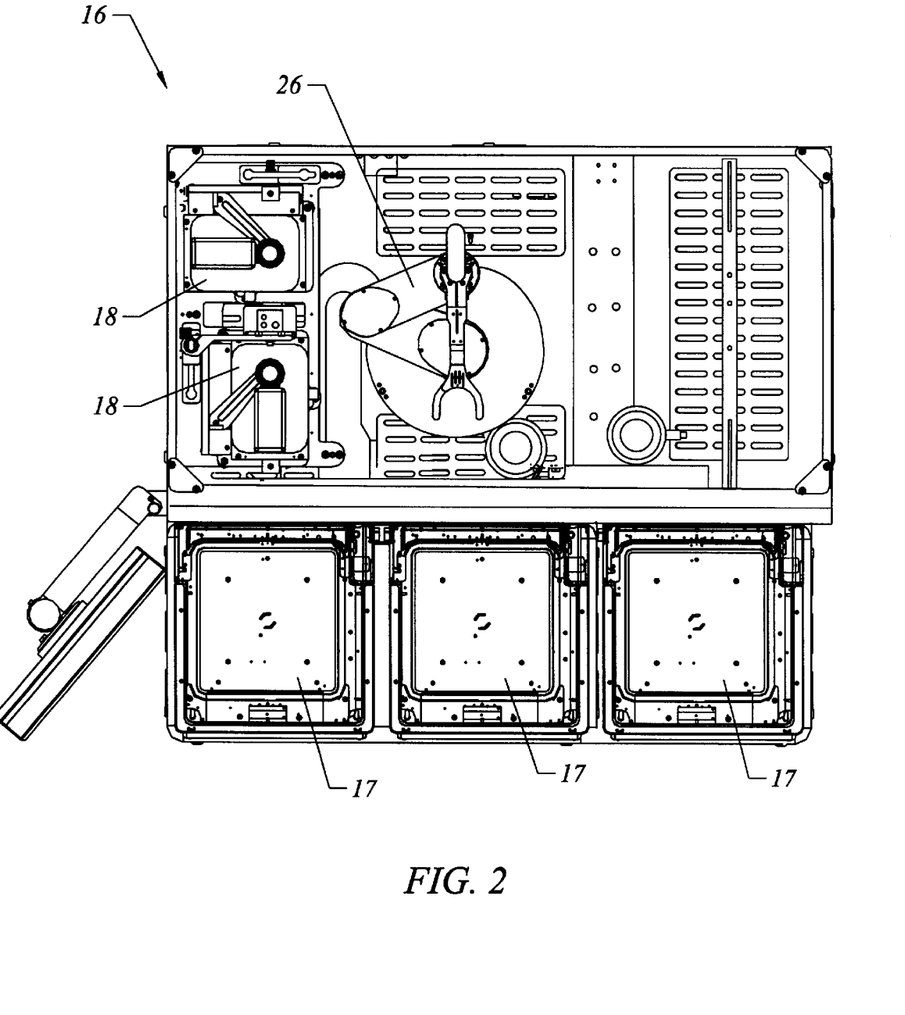
FIG. 2 is a top view of an alternative set-up in which the robot calibration system according to the present invention operates with a plurality of workstations.

Although the present invention may be used to calibrate a robot 26 to a single workstation as shown in FIG. 1, it is understood that the system according to the present invention may calibrate a robot 26 to a plurality of workstations, such as for example in a sorter 16 shown in top view in FIG. 2. Sorter 16 includes various workstations such as for example load ports 17 and aligners 18. Where the robot 26 operates with a plurality of workstations, the initial calibration process may be carried out with each workstation in succession. Thereafter, where a workstation is added or one of the workstations serviced by the robot is replaced or repositioned, it is only necessary to calibrate the new or replaced workstation to the robot. No re-calibration of the robot to the existing workstations is necessary.

Figure 3:
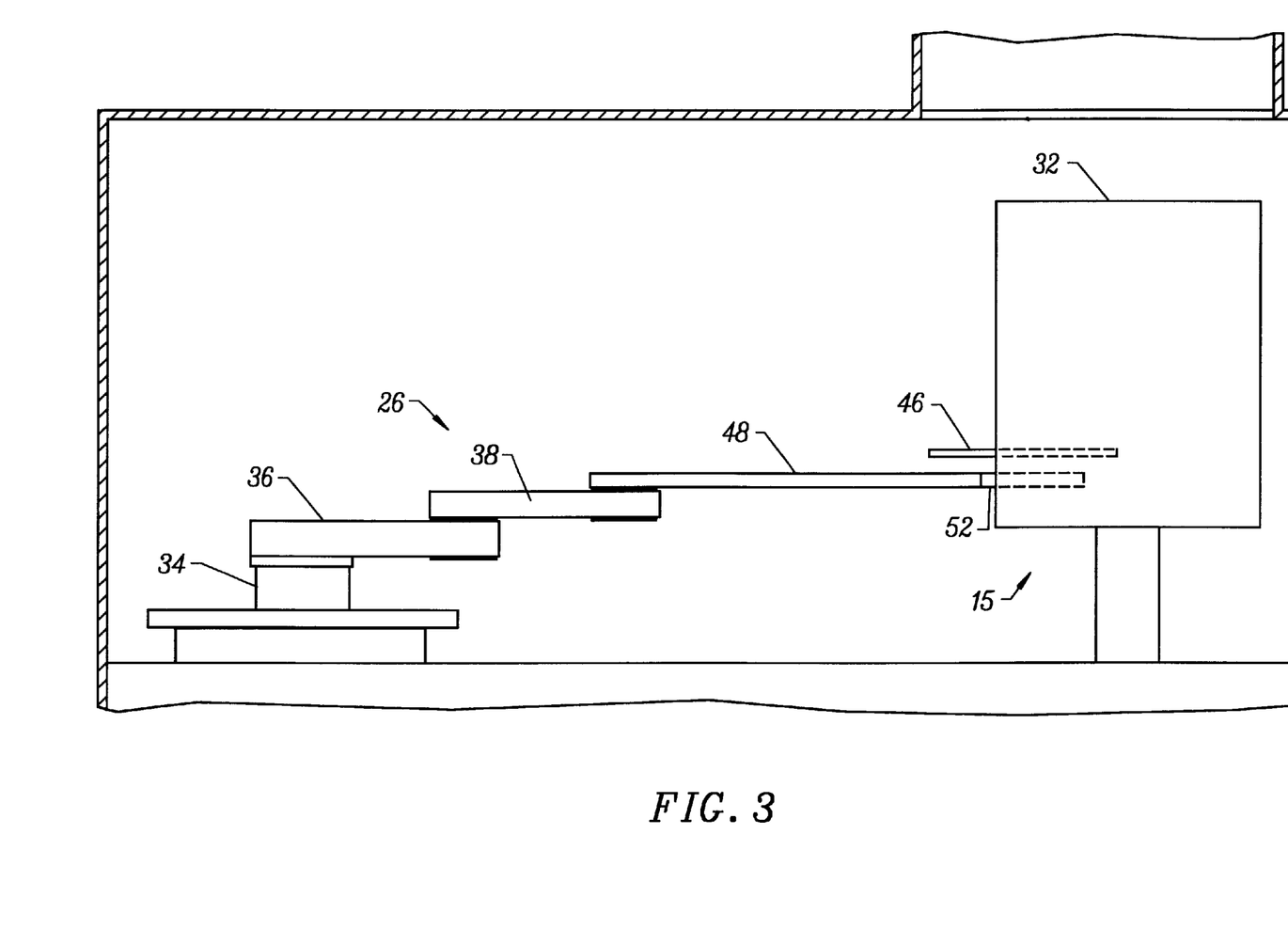
FIG. 3 is a side view of the system according to the present invention including the robot calibration system for calibration of the workpiece handling robot position relative to the station illustrating an end effector under a target.

Referring to FIGS. 1–3, the workpiece handling robot 26 includes a shaft 34 mounted through the floor 22, or base, of the workpiece handling area 20. The shaft 34 is rotatably supported on bearings within the control area 24, which bearings are in turn supported for translation along a z-axis concentric with an axis of rotation of the shaft. As a result, shaft 34 is capable of rotation about the z-axis and translation along the z-axis. The shaft 34 is preferably formed of a durable metal having low outgassing properties, such as for example aluminum with an anodized surface finish.

The workpiece handling robot 26 further includes a first arm 36 affixed to an upper end of shaft 34, and a second arm 38 pivotally attached to the first arm 36 at a mounting point. The first arm 36 is capable of rotation on shaft 34 in a first x-y plane perpendicular to the z-axis of the shaft 34. The second arm 38 is capable of pivoting about its mounting point on the first arm 36 in a second x-y plane parallel to the first x-y plane. The second arm 38 also includes an indicator 40 (FIG. 1) which indicates a transition from a black area 42 to a white area 44 on a target 46 (FIG. 6), as explained hereinafter. The first arm 36 and second arm 38 are preferably formed of a light weight, durable metal having low outgassing properties, such as, for example, aluminum with an anodized surface finish. One example of workpiece handling robot suitable for this application is a conventional AXYS-407 series robot available from Asyst Technologies, Fremont, Calif. Operation of the workpiece handling robot 26 is controlled by a control system 58 (FIG. 1) provided within the base of the robot, or located remote therefrom and connected therewith via electrical leads. It is understood that the system according to the present invention may be used on other known robotic transfer devices for transferring workpieces. Such robot systems include dual armed robots, linear slide robots, a so-called "frog leg" linkage-type robot and a six axes industrial robot. Each of these robot systems is known in the art.

The workpiece handling robot 26 also includes a workpiece support tool such as an end effector 48 (FIGS. 1, 3 and 4) pivotally attached to an end of the second arm 38 opposite the first arm 36. The end effector 48 is capable of pivoting about a mounting point on the second arm 38 in a third x-y plane parallel to the first and second x-y planes. In the preferred embodiment, the end effector 48 is assumed to be parallel and level with the support surface 30 of the cassette 32. However, a tool, such as a bubble level, may be used to adjust the robot and/or support surface of the workstation so that the cassette on the workstation is parallel to the end effector.

In one embodiment, the pivotal position of the first arm 36, second arm 38, and end effector 48 are controlled with respect to each other by a combination of the control system 58 and mechanical linkages such that the end effector is constrained to move along radials emanating from the z-axis of rotation of the shaft 34. In another embodiment, the robot arms and end effector can move according to a so-called "path planning algorithm" which is known in the art. It is understood that other robot motion is contemplated in alternative embodiments. The control system 58 also controls the movement of the robot 26 in the robot calibration system and determines a center of the target as described hereinafter.

The end effector 48 includes a workpiece support platform 52 (FIGS. 1, 3 and 4) at a distal end of the end effector (i.e., the end of end effector 48 opposite the second arm 38). Support platform 52 includes fingers 52a and 52b, and a base portion 52c which together provide a U-shaped configuration to the workpiece support platform. In order to transfer workpieces, the support platform fits into the cassette 32 in between adjacent workpieces on shelves 30. Once positioned under a workpiece, the end effector 48 moves upward (as a result of raising up of the shaft 34 along the z-axis) to lift a workpiece off of its resting place within the station 32 supported on the workpiece support platform 52, and then withdraws the workpiece from the cassette at the station.

As is known in the art, a vacuum source (not shown) may be provided in the control area 24 of the workpiece handling area, which creates a negative pressure that is communicated through the workpiece handling robot via flexible vacuum tubes to the surface of the workpiece support platform 52 of the end effector. Upon activation of the vacuum source, a negative pressure is thus formed at the surface of the support platform creating a suction capable of holding a workpiece firmly thereon. A vacuum sensor (not shown) of known construction may also be provided on the robot and associated with the vacuum system for detecting when a workpiece is engaged with the end effector and restricting the pull of air through the vacuum tubes. It is understood the present invention is not limited to the end effector depicted and that a variety of end effector designs may be used as long as the end effector has the capability to pick up and drop off flat workpieces.

While a particular embodiment of the workpiece handling robot 26 has been described above, it is understood that embodiments of the present invention can operate with various systems capable of extracting a workpiece from a cassette on a workstation, and repositioning the workpiece to a desired location. It is also understood that the workpiece handling robot can operate with various types of workstations for supporting cassettes and other workpiece carrying containers.

According to the present invention, the distal end of end effector 48 further includes a sensor 50 (FIG. 4) for detecting reflectance pattern changes on the target 46, as explained hereinafter. The sensor 50 is preferably a retro-reflective fiber optic sensor including an emitter for directing a light beam toward a surface, and a receiver for receiving that portion of the light beam reflected back off of the surface. The sensitivity of sensor 50 may be set to detect minor changes in the amount of light reflected off of a surface. One example of a sensor suitable for this application is a FX-7 series sensor manufactured by Sunx/Ramco Electric Co., 1207 Maple, West Des Moines, Iowa 50265.

Figure 4:
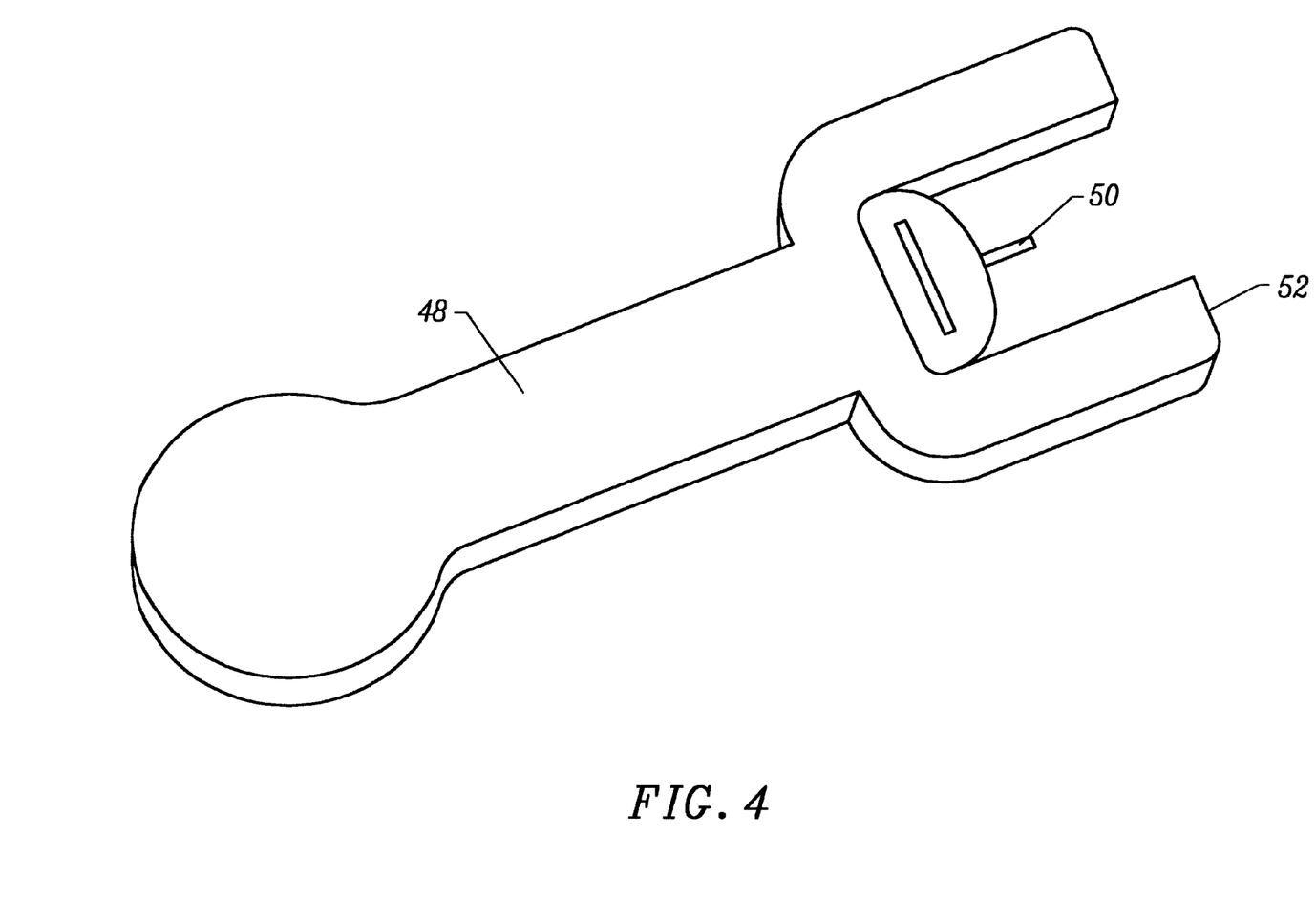
FIG. 4 is perspective view of the end effector according to the present invention including a sensor for use in the robot calibration system.

In a preferred embodiment, the sensor 50 is removably mounted to end effector 48 in between fingers 52a and 52b. It is understood that the sensor does not have to be located at a longitudinal center of the end effector 48 in alternative embodiments. However, it is understood that if the sensor is not placed at the center of the end effector, then the center of the target will be computed with a predefined offset parameter accordingly.

Figure 5:
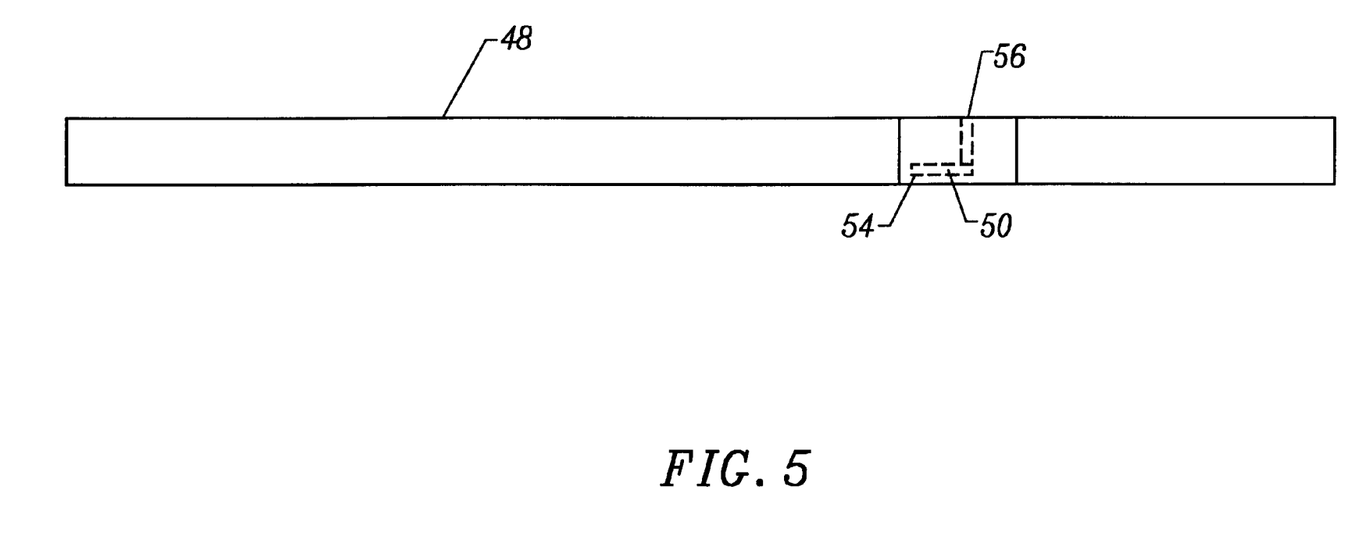
FIG. 5 is a side view of the end effector according to the present invention illustrating the sensor as an integral part of the end effector for use in the robot calibration system.

The sensor 50 is preferably mounted in a clip-on manner allowing the sensor to be temporarily attached during the calibration process and thereafter quickly and easily removed from the end effector 48. Alternatively, as shown in FIG. 5, the sensor 50 may be built into the end effector 48 such that the sensor is an integral part to and a permanent fixture within the end effector. A channel 54 (FIG. 5) may be cut into an underside of the end effector 48 and the sensor 50 inserted therein. An opening 56 on a top side of the end effector 48 is included through which the signal from sensor 50 is emitted and received. As a permanent part of the end effector, the sensor 50 may function as a redundant sensor which detects the presence of the workpiece (redundant to the vacuum sensor). It is understood that the sensor relays a signal to the control system via electrical leads threaded through the robot.

The clip-on or permanently mounted sensor may be electrically coupled to the control system via a flexibly mounted umbilical cable (not shown) and leads mounted through or along the outside of the robot. Alternatively, wireless communication protocols may be employed for sending signals to and/or from the sensor 50. In wireless embodiments, the sensor preferably includes an onboard power supply such as a battery.

Figure 6:
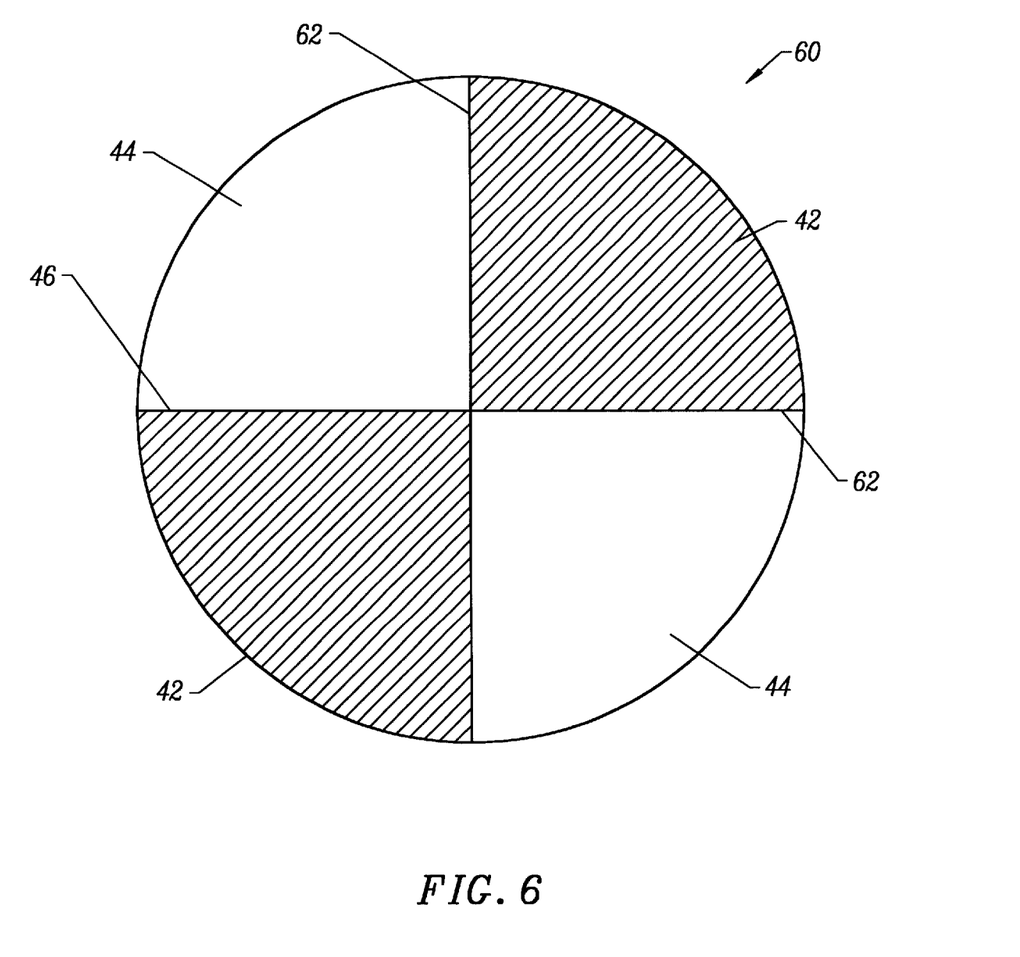
FIG. 6 is a top view of a target according to the present invention illustrating a reflectance pattern on a target for use in the robot calibration system.

With reference now to the robot calibration system, the present invention further includes the target 46 as shown for example in FIG. 6. The target is preferably the same size and configuration as the workpieces handled by the robot 26 and workstation. In use, the target is seated within a cassette as would a workpiece, and the cassette is seated on the workstation. Thereafter, the system according to the present invention determines the center of the workpiece as explained in greater detail below. Once the center of the workpiece has been determined, the control system can then identify the proper positioning of the end effector for workpiece transfer to and from the workstation. This position is then stored in the control system memory for future use.

Although the target 46 is preferably a wafer in the shape of a disk, it is understood that the target maybe square, U-shaped or any variety of shapes as long as the shape of the workpiece fits into and is complimentary to the station that will be calibrated. A reflectance pattern 60 is provided on at least one side of the workpiece, preferably the bottom, and in a preferred embodiment is divided into four quadrants of equal size. As shown in FIG. 6, two radially opposed quadrants 42 of target 46 include a black or some other non-reflective surface. The other two radially opposed quadrants 44 of target 46 may have white or some other reflective surface. It is further understood that the reflectance pattern 60 may only be formed on a portion of the target 46.

The target may be formed of any of various durable materials such as carbon fibre. Where carbon fibre is used, a white reflectance pattern may be applied to the black fibre. Alternatively, the target can be formed of a reflective, polished material such as silicon or various metals, with a black pattern applied to the surface. In a further alternative, both the white and black patterns can be applied to the target. Regardless of how the reflectance pattern is applied, the retro-reflective sensor is able to sense the transition between the black areas and the white areas on the target owing to the change in reflectance from one area to the next.

The reflectance pattern may be formed by painting the pattern on the workpiece using a silk screen process. The reflectance pattern may also be formed by laser printing a pattern and affixing the pattern on the workpiece. Moreover, the reflectance pattern may be etched onto the workpiece. It is understood that the reflectance pattern may be formed on or attached to the workpiece in a variety of ways as long as the reflectance pattern is sufficiently permanent and accurate. It is also understood that other arrangements of black and white areas can be used and varying intensities of color, such as shades of gray, may be used as long there is sufficient contrast in reflectance between alternating areas on the reflectance pattern. In further embodiments, it is understood that alternating areas may be defined by holes formed in the target.

The quadrants are separated and defined by lines 62 which intersect perpendicularly in the center of the target. It is understood that the reflectance pattern 60 may be divided into 3 areas, or more than 4 areas in alternative embodiments. Moreover, it is understood that the distinct areas need not intersect at the center of the target 46 in alternative embodiments. It is also understood that the reflectance pattern may additionally or alternatively be located on a top of the workpiece for environments where the sensor is on the bottom of the end effector or the robot itself is inverted.

As the white areas on the target reflect most of the light incident thereon, and the black areas on the target reflect very little of the light incident thereon, the sensor 50 is able to detect a change from the black area 42 to the white area 44, and visa-versa, as the sensor is moved around under the target surface. It is understood that the sensitivity of the sensor may be set to detect changes between areas of color other than black and white.

The operation of the robot calibration system of the present invention will now be described with reference to FIGS. 1 and 3. When it is desired to orient the workpiece handling robot to a station for workpiece transfer between the robot and a cassette on the station, the workpiece handling robot 26 is placed in front of the cassette 32 at the desired station. In a preferred embodiment, a target 46 is placed on the lowermost shelf 30 within the cassette as would a workpiece to be processed.

The approximate proper location of the robot 26 relative to the cassette at the station may be visually estimated by the operator and preprogrammed in the control system. With the robot 26 initially at its lowermost z-axis position, the arms of the robot move up vertically along the z-axis via the shaft 34 with the end effector 48 and sensor 50 positioned directly under the target 46. When the end effector 48 reaches the target 46, the vacuum sensor (discussed heretofore) detects proximity between the target and the vacuum sensor and sends a signal to the control system 58. This position corresponds to the z-axis height of the robot 26 for the end effector 48 to be aligned under the bottommost workpiece in the cassette 32. This parameter is then stored in the control system. Additionally, as the pitch between each shelf within the cassette is known, each height at which a workpiece may potentially be seated within the cassette is also known.

The end effector 48 then releases the target 46 and moves vertically down slightly from the target 46 so that there is very small distance between the end effector 48 and the target 46 (FIG. 3). The z-height during operation of the robot calibration system is now determined and the parameter is stored in the control system 58. The end effector 48 should be positioned close to the target 46, without contacting the target or cassette 32, when performing the calibration process so that the sensor 50 is within the sensing range and there is reliable detection of the change from the black area to the white area and visa-versa. It is understood that other known sensors may be provided to sense contact or close proximity between the end effector and a bottom of the target in order to determine the z-height of the bottommost support surface at a station. For example, a laser wafer mapping sensor or a reflective sensor (used as a proximity sensor) may be used. Such systems are discussed for example in U.S. application Ser. No. 09/173,710 entitled "Wafer Mapping System", filed Oct. 15, 1998 which application is assigned to the owner of the present invention and which application is incorporated by reference herein in its entirety.

Once positioned adjacent the bottom surface of the target, the end effector 48 proceeds to move in a search pattern around the bottom of the target. Although the path followed by the end effector in tracing the search pattern may vary in alternative embodiments, the path at least crosses the boundary between each of the quadrants 42, 44 at least once in a clockwise, or counterclockwise direction. As the end effector traces the search pattern, the sensor 50 is able to sense the transition between the black areas and the white areas on the target 46. The indicator 40, such as an LED light, is provided on the second arm 38 of the robot 26 to indicate the transition between adjacent boundaries. When the sensor 50 is located under the black area 42, the indicator 40 does not light up. When the sensor 50 is located under the white area 44, the indicator 40 lights up. If the target is misaligned so that the end effector does not transition through each of the four quadrants 42, 44 during the search pattern, an error is detected by the sensor 50 and an error signal is generated and sent to the control system 58.

Figure 7:
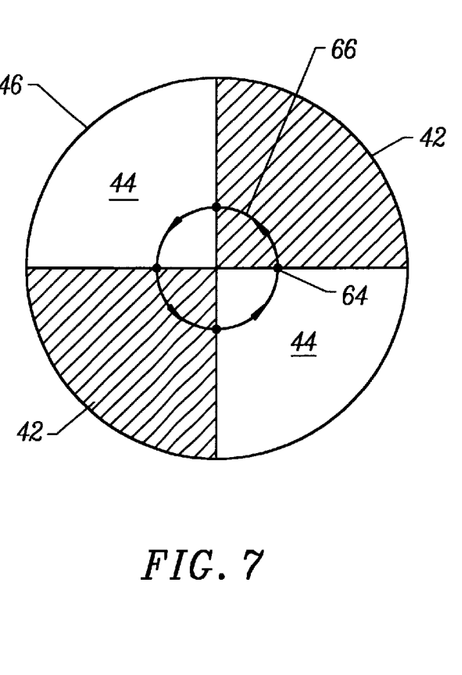
FIG. 7 is a top view of the target according to the present invention illustrating a circular search pattern made by the end effector for use in the robot calibration system.

The end effector 48 can move in a variety of search patterns. The parameters of the search patterns are stored in the control system 58, thus allowing the control system 58 to control the maneuvering of the search pattern automatically without operator assistance. For example, the end effector 48 can maneuver under the target 46 in a circular search pattern 66 (FIG. 7). The circular search pattern 66 has the advantage of having minimal vibrations in the arm because the movement of the end effector is smooth. The circular pattern also has the advantage of having precise and quick movement abilities. However, with the circular pattern, a great amount of memory in the control system must be used to store data resulting in such movement. The end effector 48 can also maneuver under the target 46 in a square search pattern 68 as shown in FIG. 8.

Figure 9:
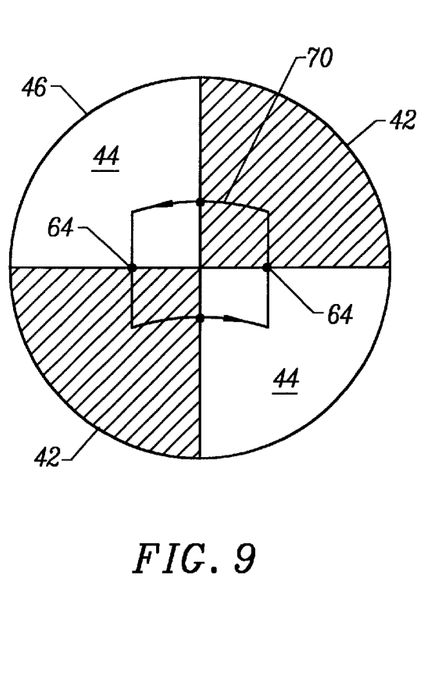
FIG. 9 is a top view of the target according to the present invention illustrating a polar coordinate square search pattern made by the end effector for use in the robot calibration system.

In an embodiment where the end effector moves in and out along radials from the center axis of the robot, the end effector 48 would maneuver using a polar coordinate square search pattern 70 (FIG. 9). In this embodiment, the end effector follows the natural movement of the wafer handling robot 26 and the parameters of the polar coordinate square pattern are easy to store in the memory of the control system. In this embodiment, the end effector may initially move radially outward from the first quadrant to a second quadrant, rotate from a second quadrant to a third quadrant, move radially from the third quadrant to the fourth quadrant, and finally rotate from the fourth quadrant back to the first quadrant. It is understood that the end effector is not limited to the search patterns described above and may move in a variety of search patterns.

Regardless of the path of the end effector, it is not necessary that the target 46 be located within the cassette in a particular angular orientation for the operation of the calibration system according to the present invention, or that the angular orientation even be known, as long as the target is properly seated in the cassette within allowable tolerances.

Figure 8:
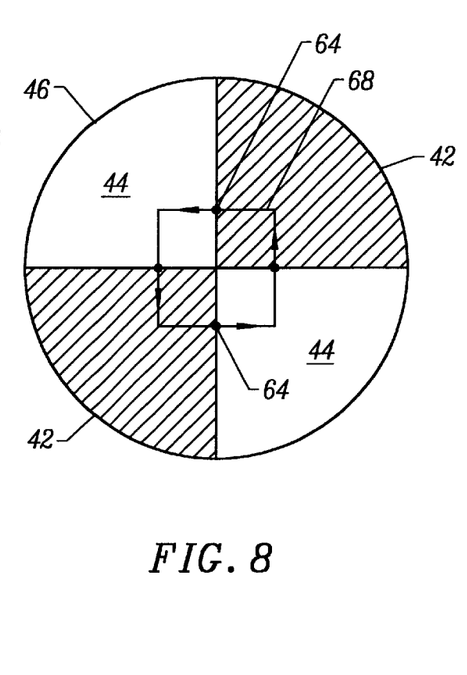
FIG. 8 is a top view of the target according to the present invention illustrating a square search pattern made by the end effector for use in the robot calibration system.

The end effector 48 may take one entire pass under the target 46 such that a complete search pattern is formed in order to determine the transition points 64 (FIGS. 7–9). Transition points are the points where the sensor 50 on the end effector 48 crosses one of the lines 62 bordering the black area 42 or the white area 44. With the four quadrant reflectance pattern 60, there are four transition points 64 which are identified by the control system in polar coordinates (i.e., an angle, $\theta$, of the robot and a radius, r, of the end effector from the axis of rotation of the robot). The control system then uses an algorithm to convert the polar coordinates into cartesian (x, y) coordinates. The first and third points lie on one of the boundary lines 62 between the quadrants, which boundary line may be expressed as an equation in the Cartesian plane through the first and third points. Similarly, the second and forth points lie on the other boundary line 62 between the quadrants, which boundary line may be expressed as a second equation in the cartesian plane through the second and fourth points. A single set of coordinates will lie on both boundary lines, which coordinates define the intersection of the lines and the center of the target 46. The equations may be solved by the control system to identify the coordinates at the center of the target. The identified center position of the target is then stored in the control system memory.

Once the center of the target at the station has been identified, the control system knows the spacial relationship between the workpiece handling robot and the station, and in particular the cassette seated on the station. Thereafter, the control system may return the end effector to that position to acquire workpieces from or present workpieces to the station as desired.

In an alternative embodiment, the end effector 48 may take multiple passes around the target. Taking multiple passes allows the computer control system 58 to acquire more data (transition points), thus, the position of the center of the target will be more accurately determined. Moreover, the end effector 48 can move in a search pattern clockwise and then repeat the search pattern counterclockwise, or visa-versa. Moving in a clockwise search pattern and then repeating the same search pattern counterclockwise has the advantage of eliminating hysteresis in the robot arm which may cause imprecise alignment and positioning of the end effector. It is understood that various numbers of boundary areas, and a variety of search patterns, may be used as long as sufficient amount of statistical data is collected such that the center of the target may be determined. Moreover, it is understood that the control system may make use of a variety of other algorithms for determining the center point from the various transition points.

Alternative embodiments of the present invention will now be described with reference to FIGS. 10–13. In the embodiments described with respect to FIGS. 10–13, parts or elements having the same function and operation as in the above-described embodiment are designated by the same reference numerals.

Figure 10:
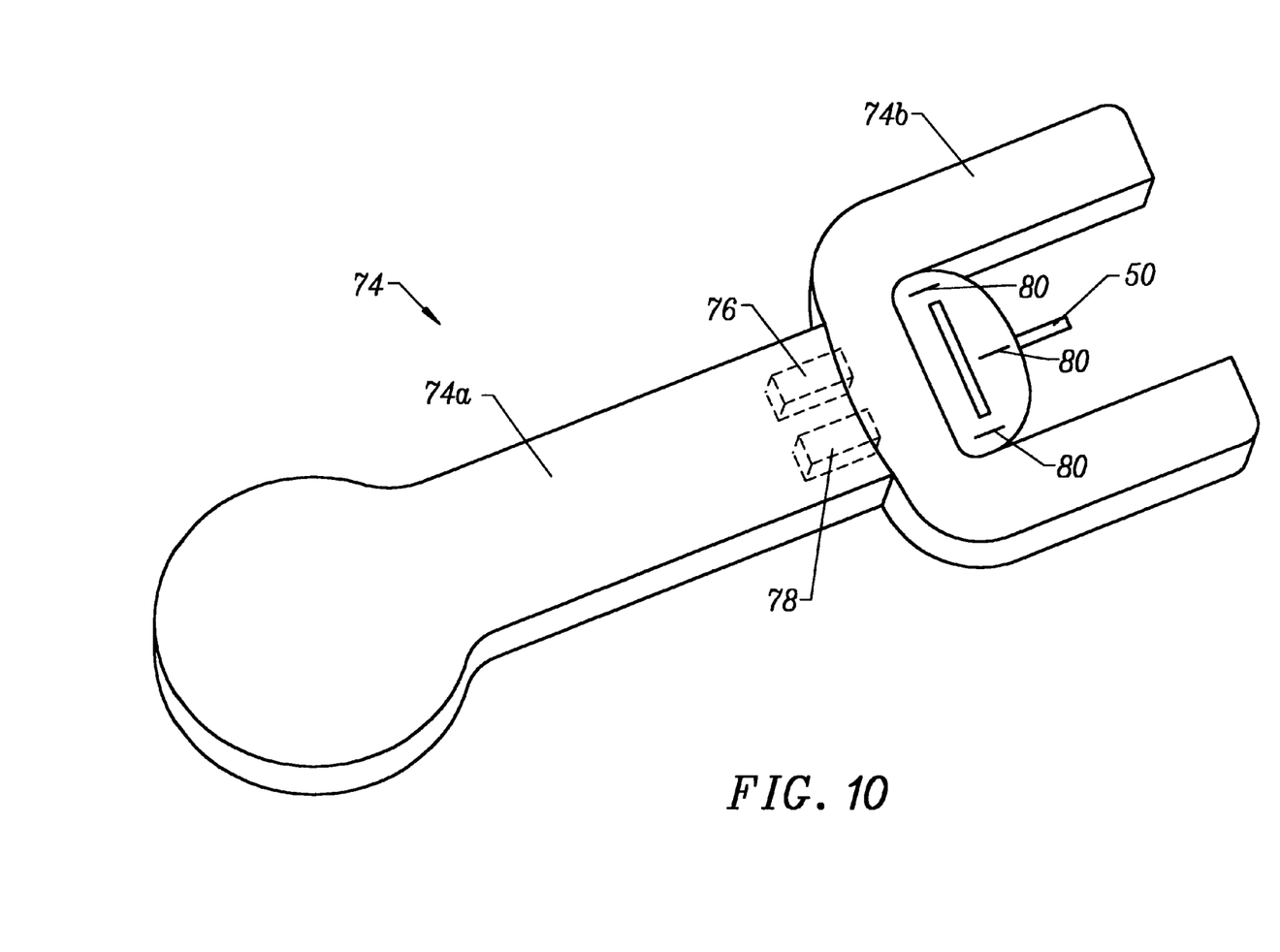
FIG. 10 is a perspective view of an adjustable end effector according to a second embodiment of the present invention.

In a second embodiment, as shown in FIG. 10, the workpiece handling robot 72 may comprise a servo wrist type robot, including an end effector 74 having a base portion 74*a* and a workpiece support portion 74*b*. In this embodiment, the workpiece support portion 74*b* is capable of pitch motion (i.e., tiling up and down) and roll motion (i.e., rotating about an axis through the base portion) with respect to the base portion 74*a*. In this embodiment, it is contemplated that the end effector may not automatically be parallel to the workpieces within the cassette 32. Thus, modification of the pitch and roll of the support portion are included to allow adjustment to parallel. With regard to the roll motion of the workpiece support portion 74*b* on the end effector 74, a servo flipper 76 may be used to adjust the roll motion. The servo flipper is mounted to portion 74*a* as explained below, and includes a rotatable output shaft (not shown) to which the portion 74*b* is mounted. In present wafer handling robots, servo flippers are already incorporated into the robot 26 and used to invert a workpiece such that the workpiece support portion 74*b* is adjustable and rotatable to any degree with respect to the base portion 74*a*. As such, the servo flipper 76 may also be used to adjust the roll motion of the workpiece support portion 74*b*.

With reference to the pitch motion, the servo flipper 76 may be mounted to the portion 74*a* by a jack screw (not shown) fitting within threaded hole 77 which allows the pitch of servo flipper 76 (and hence the workpiece support platform 74*b*) to be adjusted relative to the base portion 74*a*. The jack screw may be replaced with the miniature linear 78 actuator which may be used to automatically adjust the pitch of the workpiece support portion 74*b* during the calibration process. It is understood that mechanisms other than the jack screw mounted to the servo flipper may be used to adjust the pitch of the workpiece support portion 74*b* to the base portion 74*a*, such as for example a piezoelectric driver, a lead screw or a cam device, as well as other known devices which allow for micropositioning of the pitch. It is also contemplated to adjust pitch and roll via a pair of linear actuators without the use of a servo flipper 76.

The workpiece support portion 74*b* of the end effector 74 according to the embodiment shown in FIG. 10 would also include three thin capacitive sensors 80 (shown schematically) in order to sense the planar orientation of the workpiece support portion 74*b* with respect to the target of the cassette 32. Alternatively, the three capacitive sensors could be built into a removable teaching tool mountable on workpiece support portion 74*b* of the end effector. In operation, as in the first embodiment, the end effector 74 is moved up and aligned under the target in the lowermost shelf in the cassette. Once in close proximity to the target, the sensors 80 may be used to detect whether the workpiece support portion is parallel to the target. In the event that it is not, the pitch and roll are adjusted until the three sensors 80 are the same distance from the target 46 such that the workpiece support portion 74*b* and the target 46 are parallel.

After the workpiece support portion 74*b* is adjusted to parallel, the vertical position of the lowermost workpiece within the cassette is stored as above. The end effector 74 in the embodiment of FIG. 10 further includes the retro-reflective fiber optic sensor 50, which is used to determine the center of the target 46 via the search pattern, as previously described.

Figure 11:
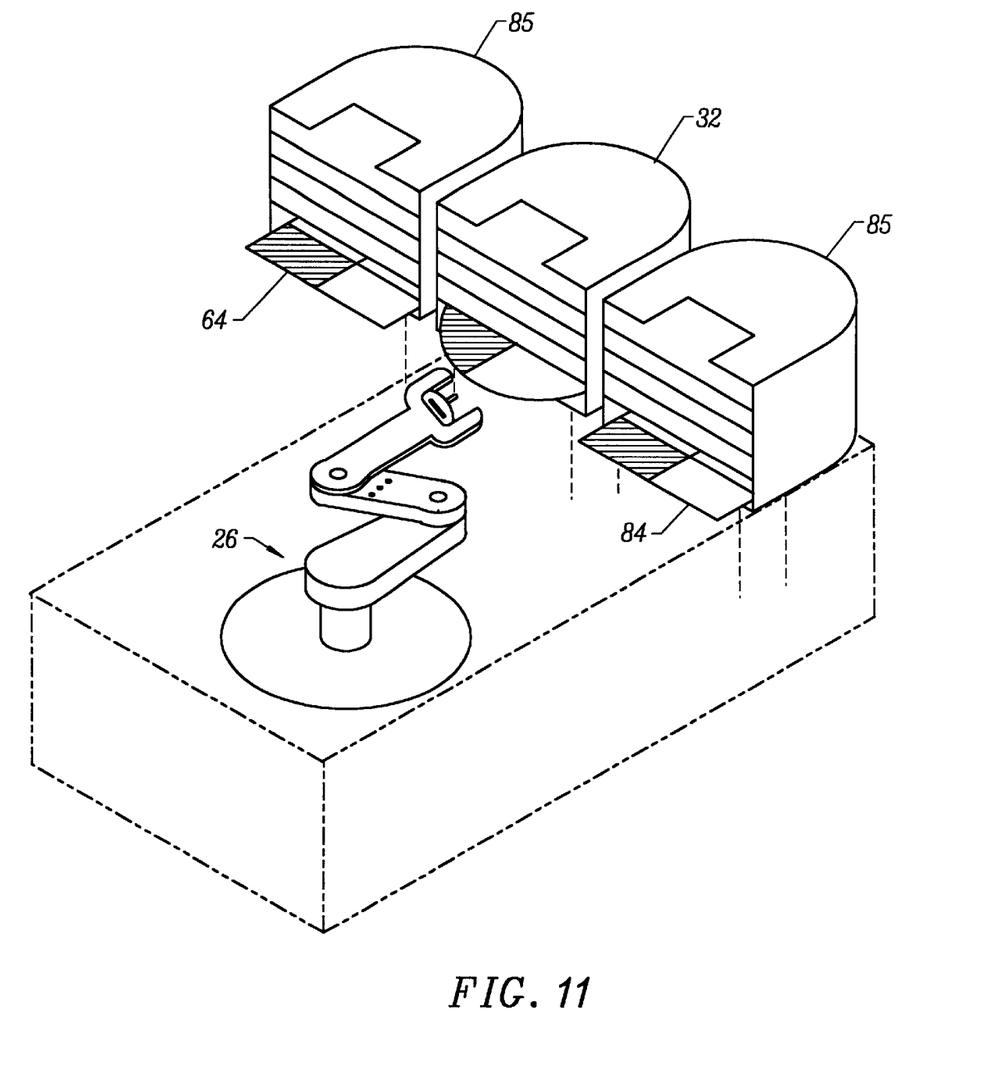
FIG. 11 is a perspective view of a system according to a third embodiment of the present invention including a robot calibration system for calibration of the workpiece handling robot position relative to the station utilizing a square target.
Figure 12:
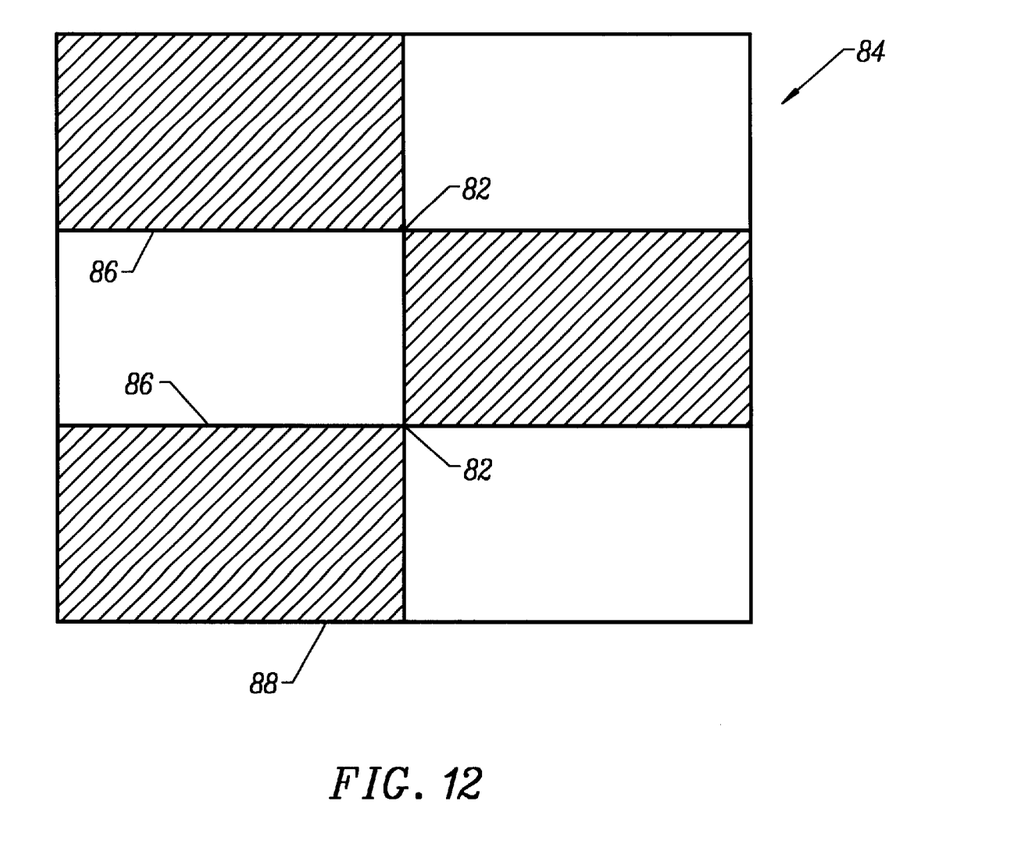
FIG. 12 is a top view of a square target according to a third embodiment of the present invention illustrating a preferred reflectance pattern for use in the robot calibration system.

In a third embodiment, as shown in FIGS. 11 and 12, the robot calibration system utilizes two points 82 on a target 84 to calibrate the workpiece handling robot 26 to a station. Similar to the first embodiment, the station supports a cassette 85 thereon. The wafer handling robot 26 is the same wafer handling robot used in the first embodiment of the present invention. However, the cassette is not radially oriented in the direction of the robot. The cassette may be facing another direction or is not located directly in front of the robot (FIG. 11). In the previous embodiment, where the target was circular, only one location (the center of the target) was required to determine the positional relation between the robot and the station. The direction of access for the workpiece was presumed to be on a straight radial approach for the robot. In this embodiment two target points 82 are necessary in order to define both the positional relation between the robot and the station, as well as the orientation of the station and the direction of access into the cassette at the station.

The target 84 (FIG. 12) in this embodiment may be square-shaped and includes the two target points previously discussed. The target points 82 are formed from two parallel lines 86 which are intersected by a perpendicular line 88. The reflectance pattern of the square target 84 may be alternating black areas 42 and white areas 44, as shown in FIG. 12. The two points 82 of the square target 84 are determined in the same way as explained above wherein the end effector 48 moves in a search pattern under the square target searching for transition points and the control system determines a location of the two points using an algorithmic equation. It is understood that other shapes may be used as long as the shape has a particular and distinct orientation.

It is understood that other types of sensors and targets may be used with the workpiece handling robot when calibrating the robot with respect to a station. For example, the vacuum sensor (not shown) discussed heretofore may be used to locate the center of the target. The vacuum sensor, which is mounted on the end effector, may be used in combination with a target having an opening in the center of the target. The vacuum sensor according to this embodiment moves around under the target searching for the opening in the center of the workpiece. The opening is located when the vacuum sensor is unable to form a suction with the target. This method would be cost effective because the hardware already exists on many currently used workpiece handling robots. Alternatively, a pressure sensor mounted on the end effector may be used instead of the vacuum sensor. Similar to the embodiment using the vacuum sensor, the pressure sensor is used in combination with the target having the opening in the center. The end effector maneuvers underneath the target without contacting the target while the pressure sensor measures a change in pressure near the surface of the target. Once the sensor locates the opening, due to a decrease in pressure, the center of the workpiece is determined. It is understood that a capacitive sensor, inductive sensor, sonic sensor, charge couple display camera or various other sensors may also be used in accordance with the present invention.

In still further embodiments, the sensor could comprise capacitive or inductive sensors which sense areas on the target of different electrical conductance. As a further alternative, the sensor could be a mechanical stylus extending toward the patterned surface of the target, and the target would include various etched or relief patterns of different elevations on the wafer.

The calibration of the wafer handling robot would be completed in the initial setup of the system, after repair work has been completed and/or when modifications in the workpiece tool are necessary. With the robot calibration system, calibration of a robot to a plurality of stations may be completed in one calibration process in a matter of minutes with repeatable and accurate results. Moreover, if a newly added station is installed, the robot may be calibrated to the new station without effecting the positional relation of the robot to other previously installed and calibrated stations. Additionally, as the same point on the end effector is always used for calibration, there is no need to re-calibrate existing stations when a station is added or modified.

The robot calibration system is inexpensive since only one sensor is required on the end effector (or on the target as discussed in the fourth embodiment) and a sensor is not necessary at every station in the workpiece tool. Also, the target is simple in design requiring a low number of parts and therefore facilitating easy configuration of the workpiece tool. This allows the robot calibration system to be universally applicable to all substrate handling tasks utilizing a robot since the target may fit in any station on which workpieces are supported.

Furthermore, the robot calibration system is efficient and allows for easy calibration of the robot relative to the stations. Since the robot calibration system is controlled by the control system, after the initial placement of the workpiece handling robot into the vicinity of the stations and placement of the targets on support surfaces at every station, the operator is free to monitor other areas and processes in the wafer fab while the calibration process takes place.

As described above, in one mode of operation, a robot is coarsely aligned to a station by a technician, and then the robot is maneuvered over a target to determine the precise relation between the robot and the target and station. In an alternative mode of operation, the technician may be omitted to provide an automatic determination of a position of a robot to one or more workstations. In such an embodiment, for example where a robot is replaced, the positional coordinates of each of the stations used by the old robot to locate the end effector at each station can be downloaded to the new robot. Thus, the movements of the old robot to properly position the end effector at the various workstations is known by the new robot.

However, the new robot may not be positioned in precisely the same place as the old robot, or the various components of the new robot may not operate in the same manner as the old robot. As such, it is likely that the downloaded information will provide only a coarse alignment of the new robot to each of the stations. Therefore, by including a sensor as described above on the new robot and targets as described above at each of the stations, the precise alignment of the new robot to each of the stations can be automatically determined.

Instead of downloading the positional information from the old robot, coarse positioning of the robot may be accomplished from a known approximate layout of the system. That is, instead of receiving coarse positioning information from the old robot, this information may be known to the controller based on a knowledge of the general layout and orientation of the components within a tool. This information of the general layout and orientation can be downloaded to a new robot, and thereafter a sensor as described above on the new robot and targets as described above at each of the stations can be used to automatically determine the precise alignment of the new robot to each of the stations.

This automatic positional determination mode can also be carried out when the robot is repaired, or when one or more stations are repaired or replaced, in the same manner as described above. Using the old positional information as a coarse alignment, the system according to the present invention can provide the precise alignment.

It is further contemplated that this automatic positional determination mode be run on a periodic basis, even when components have not been changed out or repaired, as a hands-free diagnostic tool to ensure that the robot remains correctly positioned with respect to the various stations within a tool over time. This mode may also be run at start up of the tool, after a shock to the tool or where a positioning error is otherwise detected. A further advantage of the automatic positional determination mode is that it may be initiated automatically from a remote location.

Whether running in the automatic positional determination mode or in a mode where the robot is coarsely aligned by a technician, the targets in accordance with the present invention may be permanently stored within a predetermined slot in cassettes used in the tool. It is also contemplated that a cassette have more than one permanent target provided therein, so that alignment may be construed by using one or both of the targets in a cassette.

Up to this point, the invention has been described as including a single target within cassette, pod or other workpiece container. It is further understood that more than one target may be provided in the cassette, pod or workpiece container at different elevations. In such an embodiment, the center of a lower target identified by the sensor according to the present invention can be compared against the center of the upper target identified by the sensor. Where the centers deviate from each other, this can indicate that the carrier is deformed or otherwise defective.

In a further alternative embodiment, a reflectance pattern as described above may be affixed directly to the station. In such an embodiment, the precision alignment of the robot can be carried out even where there is no cassette at the station.

Up to this point, the reflectance pattern has been described as being only at a station. However, it is understood that a target having a reflectance or other pattern as described above can be positioned anywhere within the three dimensional stroke of the robot to orient the robot or perform diagnostics within the tool. For example, by providing a target at an arbitrary reference point of known X, Y, and Z location, when a robot is changed, the new robot can be aligned to the target at the reference point in accordance with the principles of the present invention. Once aligned, the robot is then oriented within the tool and can precisely access the stations within the tool. As described above, the pattern without the target may also be provided at a reference point to provide precise alignment of the robot to the stations in the tool.

Although the invention has been described in detail herein, it should be understood that the invention is not limited to the embodiment herein disclosed. Various changes, substitutions and modifications may be made thereto by those skilled in the art without departing from the spirit or scope of the invention as described and defined by the appended claims.

What is claimed is:

1. A system for determining a relative position between a station including a workpiece support surface and a wafer handling robot having an end effector and a sensor, the system comprising:

a target supported on the workpiece support surface;

a reflective pattern provided on a side of said target, said reflective pattern having reflective and non-reflective areas separated by transition lines; and control means for (1) moving the sensor in a search pattern around portions of said target while the sensor is in close proximity to said reflective pattern, (2) recognizing when the sensor detects said transition lines, and (3) determining a position on said target based upon the location of said transition lines.

2. A system for determining a relative position between a reference point within a tool and a wafer handling robot having an end effector and a sensor, the system comprising:

a target mounted within the tool at the reference point;

a reflective pattern provided on a side of said target, said reflective pattern having reflective and non-reflective areas separated by transition lines; and a controller for (1) moving said sensor in close proximity to said reflective pattern, said sensor moving in a predetermined search pattern, (2) receiving information from said sensor when said sensor detects transition lines, and (3) determining a position of the reference point relative to the robot using said position of said transition lines and storing said position.

3. The system as recited in claim 1, wherein said target is disk-shaped.

4. The system as recited in claim 1, wherein said reflective pattern is located on a bottom side of said target.

5. The system as recited in claim 1, wherein said reflective pattern forms a four quadrant configuration such that there are two opposing non-reflective areas and two opposing reflective areas.

6. The system as recited in claim 1, wherein the sensor is removably mounted on the end effector.

7. The system as recited in claim 1, wherein the sensor is an integral part of the end effector.

8. The system as recited in claim 1, further including an indicator on the robot for indicating when the sensor transitions from a reflective area to a non-reflective area, and from a non-reflective area to a reflective area.

9. The system as recited in claim 1, wherein said target is square-shaped, and wherein said reflective pattern includes at least six transition lines.

10. A system for determining a relative position between a station that includes a workpiece support surface and a robot having an end effector that includes a sensor, the system comprising:

a target capable of being supported on the workpiece support surface;

a reflective pattern provided on a side of said target, defining reflective and non-reflective areas on said target, each said reflective and non-reflective area separated by a transition line;

control means for (1) moving the sensor in a search pattern around portions of said target while the sensor is in close proximity to said pattern, (2) recognizing when the sensor detects a transition line, and (3) determining a position on said target based upon the location of each transition line; and proximity sensors for sensing if the end effector is parallel to said target.

11. The system as recited in claim 10 further including an actuator for positioning the end effector parallel to said target based on feedback from said proximity sensors.

12. A method for determining a relative position between a station having a support surface and a robot having an end effector that includes a sensor whereby the robot is capable of maneuvering the sensor in a three dimensional space, the method comprising the steps of:

(a) supporting a target that has a reflective pattern having reflective and non-reflective areas separated by transition lines;

(b) maneuvering the sensor in a predetermined search pattern in close proximity to the reflective pattern on the target;

(c) sensing the transition lines;

(d) determining a location of the target based upon the transition lines sensed in step (c) in order to determine a position of the robot relative to the station; and (e) storing the location of the target.

* * * * *